(12) United States Patent
McConachie

(10) Patent No.: US 10,878,289 B2
(45) Date of Patent: Dec. 29, 2020

(54) METHODS AND SYSTEMS FOR DETERMINING ONE OR MORE ACTIONS TO CARRY OUT IN AN ENVIRONMENT

(71) Applicant: Thales Holdings UK Plc, Reading (GB)

(72) Inventor: Robert Michael McConachie, Crawley (GB)

(73) Assignee: Thales Holdings UK Plc, Reading (GB)

( * ) Notice: Subject to any disclaimer, the term of this patent is extended or adjusted under 35 U.S.C. 154(b) by 0 days.

(21) Appl. No.: 16/692,563

(22) Filed: Nov. 22, 2019

(65) Prior Publication Data

US 2020/0167607 A1 May 28, 2020

(30) Foreign Application Priority Data

Nov. 22, 2018 (GB) .................................. 1819058.7

(51) Int. Cl.
*G06N 7/06* (2006.01)
*G06K 9/62* (2006.01)
(Continued)

(52) U.S. Cl.
CPC .......... *G06K 9/6257* (2013.01); *G06F 30/20* (2020.01); *G06K 9/6263* (2013.01); *G06N 20/00* (2019.01)

(58) Field of Classification Search
None
See application file for complete search history.

(56) References Cited

U.S. PATENT DOCUMENTS 7,630,874 B2 12/2009 Fables et al.
9,024,757 B1 * 5/2015 Miller .................... G08B 31/00
340/540
(Continued)

FOREIGN PATENT DOCUMENTS

JP 2006-146858 6/2006
WO WO 03/042955 5/2003

OTHER PUBLICATIONS

Grier, Rebecca A., et al. "SCIPR: A computational model to simulate cultural identities for predicting reactions to events." Proceedings of the second international conference on computational cultural dynamics. sn, 2008. (Year: 2008).*
(Continued)

Primary Examiner — Hal Schnee
(74) Attorney, Agent, or Firm — Dority & Manning, P.A.

(57) ABSTRACT

A computer-implemented method for generating a simulated environment in which the behaviour of one or more individuals is modelled, the method comprising: defining a state of the environment at a first point in time; receiving an input defining an action to be performed by one or more individuals in the simulated environment; and in response to the input, updating the state of the environment based on a social-ecological model, wherein the social-ecological model simulates the behaviour of people within the environment and how the people respond to changes associated with said action, wherein the social-ecological model is a machine learning model that is trained using data reflective of real-life past events, the social-ecological model being configured to accept as input a parameterised dataset describing the state of the environment at the first point in time and to output an updated dataset that describes the updated state of the environment.

23 Claims, 4 Drawing Sheets

(51) Int. Cl.
  *G06N 20/00* (2019.01)
  *G06F 30/20* (2020.01)

(56) References Cited

U.S. PATENT DOCUMENTS

| | | |
|---|---|---|
| 9,117,316 B1 | 8/2015 | Crutchfield, Jr. et al. |
| 9,690,784 B1* | 6/2017 | Hughes ................ G06F 3/0481 |
| 10,332,035 B1* | 6/2019 | Abdi Taghi Abad ........................ G06N 20/00 |
| 2007/0130098 A1* | 6/2007 | Hanneman ............ G06Q 10/04 706/60 |
| 2007/0207846 A1 | 9/2007 | Burak et al. |
| 2011/0008758 A1 | 1/2011 | Kortas et al. |
| 2014/0244658 A1 | 8/2014 | Mahmud et al. |
| 2015/0127593 A1 | 5/2015 | Gramuglio et al. |
| 2016/0055420 A1* | 2/2016 | Karanam ............... G06N 5/048 700/52 |
| 2019/0050686 A1* | 2/2019 | Moustafa ................ G06F 3/017 |
| 2020/0007934 A1* | 1/2020 | Ortiz ............... H04N 21/23424 |

OTHER PUBLICATIONS

International Search Report and Written Opinion from PCT/GB2019/053269, dated Feb. 6, 2020, 6 pages.

Pelechano et al., "Controlling Individual Agents in High-Density Crowd Simulation", Proceedings of the 2007 ACM Siggraph/Eurographics Symposium on Computer Animation, San Diego, California, Aug. 3-4, 2007. pp. 99-108.

\* cited by examiner

METHODS AND SYSTEMS FOR DETERMINING ONE OR MORE ACTIONS TO CARRY OUT IN AN ENVIRONMENT

FIELD

Embodiments described herein relate to methods for determining one or more actions to carry out in an environment. Embodiments also relate to relate to computer-implemented methods for generating a simulated environment in which the behaviour of one or more individuals is modelled.

BACKGROUND

The ability to model different scenarios in a computer-based environment is an important tool for strategic planning. By modelling the response of actors and systems to different stimuli (such as user-input commands, or computer-generated commands), it is possible to simulate the outcome of different courses of action, and so help to determine an appropriate strategy when confronted with the same choices in the real world.

Conventional computer-based models are typically programmatically constructed by using configurable rule sets to define model characteristics. A problem arises, however, when configuring such models to behave in realistic ways (i.e. in ways that accurately simulate the nature of real-world events). In particular, it may be very difficult or impossible to reliably replicate complex environments and scenarios, or to verify that the simulation outcomes are representative of the real world. Part of this problem arises from the fact that such models tend to focus on aspects of the environment that are well understood and parameterised, whilst ignoring or discounting other aspects that are harder to model, of for which data is lacking. In addition, conventional inference engines, being based on applications of fuzzy logic, Bayesian inference, reasoning, or mathematical optimisation, are logically correct and as such are unlikely to be suited to the representation of complex, often irrational abstractions of the real world. The use of simulations that are limited in this way can result in an inaccurate or incomplete representation of the environment of interest. Such simulations will inevitably fail to address the full gamut of the operational environment and will, therefore, be incapable of supporting many decisions underpinned by established doctrine, tactics, techniques, or procedures.

Efforts to expand the scope and fidelity of simulations, and/or the complexity of scenarios, have typically been achieved in two ways. The first is to extend the simulation engine, requiring time-consuming and expensive software development activity. Existing scenarios may require redefinition, and new scenarios will need to be constructed, involving both developer/supplier and end user/customer resources. The specific methods pertaining to the definition of these scenarios vary between solutions, and may be non-trivial.

The second method, which is increasingly being employed, is to supplement the constructive simulation with role players; real people who can enhance the scenario by adding additional content through their actions, dialogue, or interaction with aspects of the integrated training system. Such role players are typically subject matter experts, and provide domain-specific skills and knowledge. Due to the labour involved, this option can be expensive, and is highly dependent upon careful planning, and/or disciplined role-players, for credible and repeatable scenario simulation.

It follows that there is a need to develop tools for enhancing the range and/or accuracy of computer simulations of real-world scenarios.

SUMMARY

According to the present invention, there is provided a method for determining one or more actions to carry out in an environment, the method comprising:
   receiving action data, the action data defining an action to be performed in a simulated environment corresponding to the environment;
   conducting, based on application of the action data to a social-ecological model, a simulation of performance of the action in the simulation environment, the simulation comprising presentation of a simulated response that indicates an expected social response to performance of the action, wherein the social ecological model is a computer-implemented model configured to identify social responses to actions within the environment, the social ecological model being generated by obtaining environment data comprising a parameterized dataset indicative of actions taken by one or more individuals within the environment and corresponding social responses to the actions;
   determining, based on the simulated response, an action to be taken; and
   generating instructions for carrying out the action in the environment.

The environment data may be used to train the social-ecological model. The environment data may include information that is reflective of public sentiment responsive to the real-life past events.

Generating the social-ecological model may comprise identifying social responses to actions within the environment based on the public sentiment responsive to the real-life past events.

The data used to train the social-ecological model may include one or more media items.

The social-ecological model may be trained to determine a temporal relationship between two or more real-life past events. The social-ecological model may be trained to determine a temporal relationship between a real-life past event and a change in public sentiment following the event. The change in public sentiment may be expressed through material released via one or more media outlets or platforms. The material may be include one or more of news reports, news-feeds, web blogs, and social media posts.

A time to elapse between receiving the action data and presenting the simulated response may be based on the temporal relationships as determined by the social-ecological model.

Conducting the simulation may comprise generating one or more simulated media items within the simulated environment that report on the action performed. The simulated media items may include one or more of news reports, news-feeds, web blogs, and social media posts.

Within the simulated environment, individuals may be modelled as belonging to one or more demographics. For each demographic, the mood of individuals in that demographic may also be modelled. In conducting the simulation, the mood of the individuals in each demographic may also be simulated.

When conducting the simulation, one or more simulated media items may be generated so as to convey the change in mood of the individuals in the one or more demographics.

Conducting the simulation may comprise modelling aspects of the environmental infrastructure.

Conducting the simulation may comprise modelling a result of a change in the mood of one or more demographics on the environmental infrastructure.

The action data may be received from one or more users interacting with the simulated environment.

The method may further comprise:
receiving further action data following conducting the simulation; and
in response to receiving the further action data, conducting a further simulation based on the social-ecological model.

The social-ecological model may be updated during the course of the simulation. Updating the social-ecological model may comprise re-training the model with additional environment data. The additional environment data may be data obtained during the time in which the simulation is in progress.

The environment may comprise a military scenario in which one or more individuals' actions in the environment serve to control one or more military forces deployed in the environment.

According to a second aspect of the present invention, there is provided a computer readable medium storing computer executable instructions that when executed by the computer will cause the computer to carry out a method according to the first aspect of the present invention.

According to a third aspect of the present invention, there is provided a system comprising one or more computer processors configured to execute a method according to the first aspect of the present invention.

The computer system may comprising a user interface for receiving instructions from a user, the computer processor being configured to use the instructions as the action data.

Also disclosed herein is a computer-implemented method for generating a simulated environment in which the behaviour of one or more individuals is modelled, the method comprising:
defining a state of the environment at a first point in time;
receiving an input defining an action to be performed by one or more individuals in the simulated environment; and
in response to the input, updating the state of the environment based on a social-ecological model, wherein the social-ecological model simulates the behaviour of people within the environment and how the people respond to changes associated with said action;
wherein the social-ecological model is a machine learning model that is trained using data reflective of real-life past events, the social-ecological model being configured to accept as input a parameterised dataset describing the state of the environment at the first point in time and to output an updated dataset that describes the updated state of the environment.

The data used to train the social-ecological model may include information that is reflective of public sentiment responsive to the real-life past events. The data used to train the social-ecological model may include one or more media items.

The social-ecological model may be trained to determine a temporal relationship between two or more real-life past events. The social-ecological model may be trained to determine a temporal relationship between a real-life past event and a change in public sentiment following the event. The change in public sentiment may be expressed through material released via one or more media outlets or platforms.

The material may include one or more of news reports, news-feeds, web blogs, and social media posts.

The time to elapse between receiving the input and updating the state of the environment to reflect a particular outcome of the input may be based on the temporal relationships as determined by the social-ecological model.

Updating the state of the scenario may comprise generating one or more simulated media items within the environment that report on the action performed by the one or more individuals. The simulated media items may include one or more of news reports, news-feeds, web blogs, and social media posts.

Within the environment, the individuals may be modelled as belonging to one or more demographics. For each demographic, the mood of individuals in that demographic may be modelled. When updating the state of the environment, the mood of the individuals in each demographic may also be updated. The one or more simulated media items may be generated so as to convey the change in mood of the individuals in the one or more demographics.

Defining the state of the environment may comprise modelling aspects of the environmental infrastructure. Updating the state of the environment may comprise modelling a result of a change in the mood of the one or more demographics on the environmental infrastructure.

The input may be received from one or more users interacting with the simulated environment.

The method may comprise receiving a further user input following update of the state of the environment and in response to receiving the further input, again updating the state of the environment based on the social-ecological model.

The social-ecological model may be updated during the course of the simulation. Updating the social-ecological model may comprise re-training the model with additional data. The additional data may be data generated during the time in which the simulation is in progress.

The simulated environment may comprise a military scenario in which the one or more individuals' actions in the environment serve to control one or more military forces deployed in the environment.

Also disclosed herein is a computer readable medium storing computer executable instructions that when executed by the computer will cause the computer to carry out the above described methods.

Also disclosed herein is a computer system comprising one or more computer processors configured to execute the above described methods. The computer system may comprise a user interface for receiving instructions from a user. The one or more computer processors may be configured to use the instructions as the input for defining the action to be performed by one or more individuals in the simulated environment.

In contrast to conventional models, embodiments as described herein take into consideration additional "social-ecological" factors when simulating a course of events. Such factors may pertain to military, economic, social, infrastructure and information aspects (PMESII) of the environment, and include, for example, geographical, organisational, and cultural-specific responses to events, political and economic responses, and more generally, the representation of general population sentiment, attitudes, and propensity for decisive action. These factors underpin irrational and sub-optimal decision making in the real-world and in this respect can be considered as important (if not more so) than predictable, logical behaviours. By incorporating such factors through the use of a social-ecological model, embodiments can help to increase the fidelity and complexity of represented environments and scenarios, extending the scope of complex and chaotic systems models. At the same time, embodiments can help to reduce the resources (time/cost/effort) required to generate and maintain these simulations.

BRIEF DESCRIPTION OF DRAWINGS

Embodiments of the invention will now be described by way of example with reference to the accompanying drawings in which.

DETAILED DESCRIPTION

Embodiments as described herein seek to construct realistic executable software models from raw data sources; yielding time and cost saving benefits to the user, as well as removing the requirement for programming expertise to perform updates.

Figure 1:
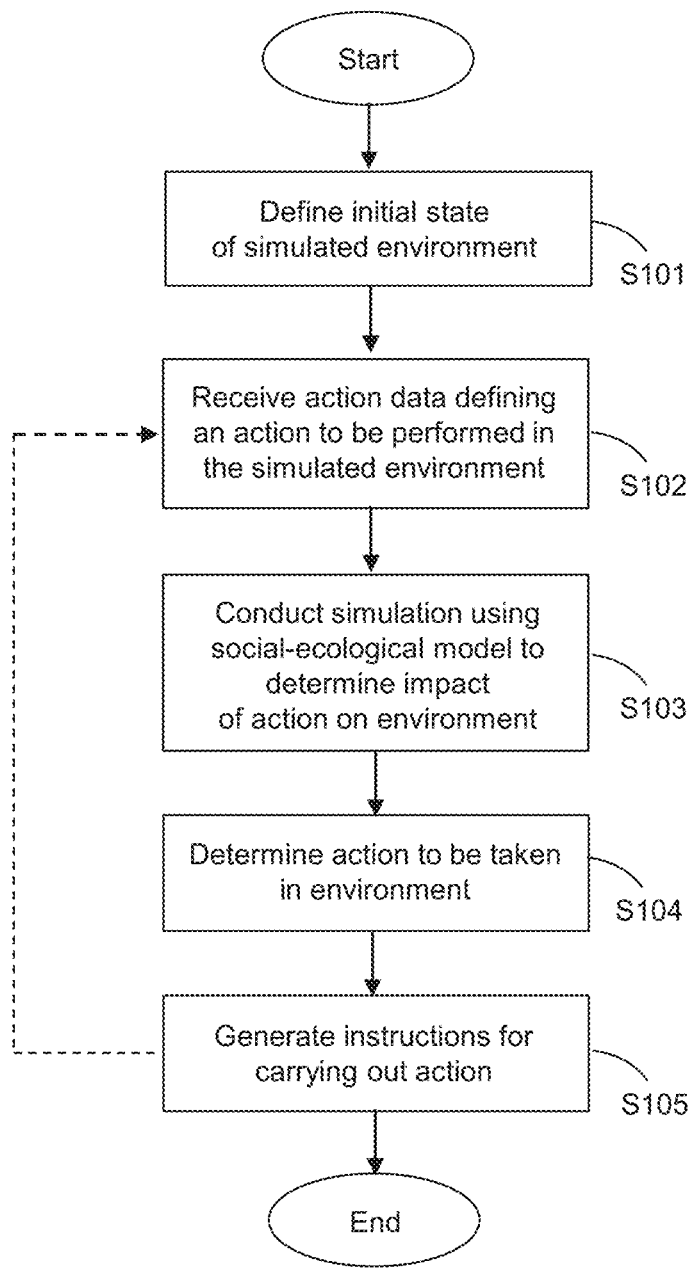
FIG. 1 shows a flow-chart of steps carried out in an embodiment.

FIG. 1 shows an example of a method according to an embodiment. The method commences by establishing a simulated environment in which different events can be programmed to occur (step S101). The simulated environment may be similar to that seen in computer strategy games and may feature an array of (computer-generated) actors that have various behavioural profiles and who can interact with one another and the environment.

Depending on the nature of the simulation to be run, the environment may include various types of real-world infrastructure, including, for example, communications networks, transport networks, electrical grids, as well as schools, hospitals, fire-stations, police-stations and other sites associated with emergency services, offices, religious buildings/places of worship, farms, warehouses (e.g. for storing food), factories and military installations.

In some embodiments, the economic status of the different actors in the environment may be modelled. For example, actors may be split into different demographics, based on location and/or other societal factors, including age, religion, gender, for example. Each demographic may be modelled as having a particular economic status, which may rise or fall depending on events taking place in the environment. Some demographics may be modelled as having particular political affiliations, cultural mores, and different demographics may also be modelled as having different levels of education. It will be appreciated that there may be overlap between these demographics; for example, two individuals might belong to the same economic demographic but have very different political viewpoints, meaning they are associated with different political demographics.

The actors may be provided with a minimum required resource level that defines the minimum amount of food reserves, commodities and/or energy (fuel) that are required by each individual in order to maintain a steady state. Here, a "steady state" may comprise a repetitive cycle in which actors pursue every-day activities by going to work during the day and returning home in the evenings, for example. The actual resource level that is available to each individual in a particular location and/or demographic may be rationed within the simulated environment, and may vary according to economic status. In some embodiments, the actors may be programmed to seek to maintain their available resource level above a threshold, possibly at the expense of others, either by leveraging their greater economic potential, or by military endeavour. For example, certain demographics may be allocated a particular military strength that may allow individuals belonging to those demographics to exert pressure on those of lower military strength.

In step S102, the initial state (i.e. the state of the environment at a first point in time) is perturbed by receipt of action data that defines an action to be performed within the environment. The action data may take the form of a random perturbation introduced into the simulation, or alternatively may be provided as an instruction received from a user interacting with the simulated environment. For example, the simulated environment may provide a training environment in which (real-world) individuals can trial different strategies by carrying out different actions and exploring how the actors in the environment respond to those actions. The simulated environment may, for example, be a fully or immersive simulation, such as a virtual reality VR environment, in which the user is able to interact with the environment and issue commands through use of one or more hand-held control devices. Alternatively, the simulated environment may be graphically presented to the user on a computer screen through one or more graphs, pictures, text boxes and statistics, etc., with the user being able to issue commands by typing into, or selecting from options in a graphical user interface GUI, or by other means, such as voice input through a microphone connected to the computer.

The user may be granted a degree of authority to shape events within the environment through their actions. For example, the user may take on the role of a politician having responsibility for setting the political agenda or financial policy, or a commander in the armed forces with responsibility for deployment and manoeuvring of those forces. The user may be tasked with making decisions as to whether to launch military action against other regions, and whether or not to deploy weapons and personnel in the interests of pursuing a particular political or military objective.

The simulation may model the response to the perturbation event by considering the effects on the various demographics in the environment. For example, a user may decide to input action data by increasing the tax levied on individuals of higher economic status, whilst reducing the tax burden on individuals of lower economic status. In this case, the simulation may respond by reducing the gap in economic status between the two demographics. In another, different example, the user may input action data by deciding to deploy military forces to a region overseas, with the aim of achieving a particular strategic objective. Here, the simulation may model an effect of that decision as a reduction in the level of resources available to each individual in the overseas region.

In addition to the modelling the effects of the perturbation in terms of changes in social demographics and/or resource levels, the simulation may also model effects on sentiment within the various demographics. That is, the simulation may provide an indication of how sentiment within a particular demographic changes in response to a particular action instigated by the user. In a simple example, the mood of a particular demographic may be modelled as one of three possibilities: positive, ambivalent and negative. In response to the receiving the action data, the mood of a particular demographic may switch between these alternatives. For example, in the case of levying higher taxes on those of higher economic status, the mood of individuals that enjoy that higher economic status may change from positive to negative, or from ambivalent to negative. In the case of the decision to deploy military forces overseas, the mood of a more liberal demographic may switch from ambivalent to negative, whilst that of a more conservative demographic may remain as ambivalent, or possibly switch to positive. The change in mood may itself be dependent on the available resource levels in the domestic location and the overseas region. For example, a demographic may be inclined to take a more positive view of a decision to launch military action overseas if it is perceived to be necessary to retain a minimum required resource level at home; conversely, the mood of the demographic may become negative if the level of available resources in the domestic location is already considerably above the minimum required level.

A change in the mood or sentiment of a particular demographic may itself translate into subsequent actions being carried out by the individuals in the environment, which in turn may have knock-on effects that are then also represented in the simulation. For example, a change in economic status of a particular demographic may precipitate a workers' strike that results in part of a whole of the transport infrastructure being shut down for a period of time. The resultant strike may be accompanied by marches and lead to further changes in the mood of demographics living in the affected area. In an extreme example, a chain of events may be triggered in which the outcome is civil unrest in a particular location or country.

If being used as a training simulation, the user may be provided with opportunities throughout to instigate additional changes (again by input of action data), aimed at halting or reversing the change in sentiment expressed among the various demographics.

In order to model the effects on public sentiment of a particular event or course of action instigated by the user, the simulation makes use of a social-ecological model (step S103). The social-ecological model is a software algorithm that takes as input a parameterised data set that models the state of the environment at a particular point in time, and outputs a similarly parameterised data set that reflects the state of the environment in response to the action having been carried out. The output from the social-ecological model is used to update the state of the simulated environment. Based on the results of the simulation, a determination is made as to an appropriate action (or course of action) to perform in the environment (step S104). In step S105, a set of instructions for carrying out the determined action is generated. The instructions may, for example, be provided as written instructions to one or more people tasked with implementing the user's decision. The instructions may also take the form of computer-executable instructions that can be fed back into the simulation as additional action data, with the simulation being updated based on the new action data. The cycle of conducting the simulation, determining the action(s) to be taken based on the results of the simulation, generating instructions for carrying out the action(s) and conducting the simulation again using the generated instructions may be repeated one or more times.

Figure 2:
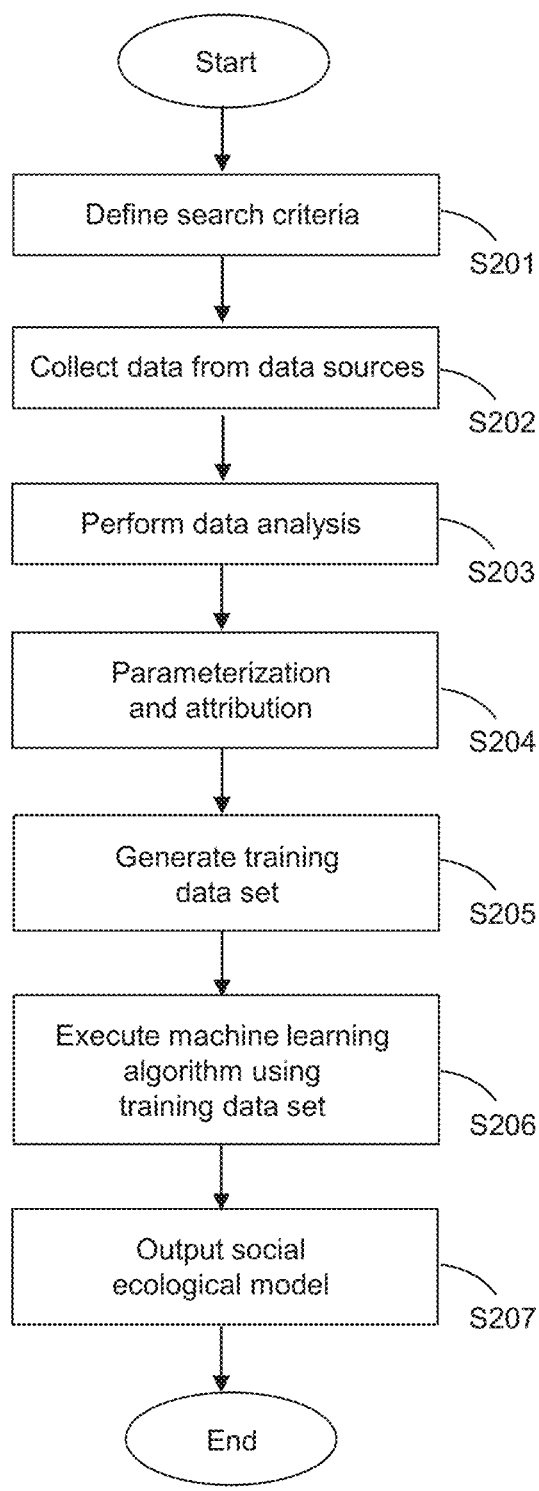
FIG. 2 shows a flow-chart of steps involved in generating a social-ecological model.

An example of how the social-ecological model is generated will now be explained by reference to FIG. 2. The social-ecological model employs advances in two areas of computing science: (i) data collection and exploitation (or 'data analytics'), and (ii) machine learning (also referred to as 'artificial intelligence').

Figure 3:
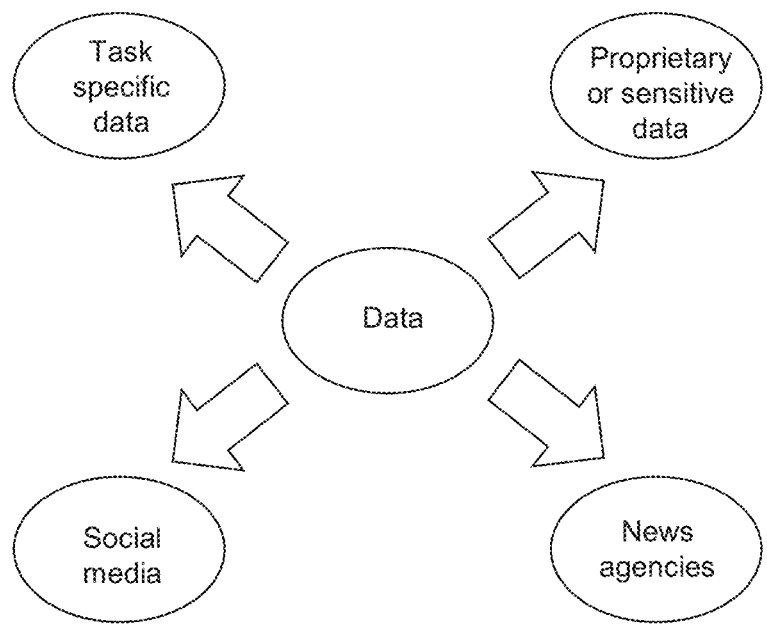
FIG. 3 shows examples of data sources used in generating the social-ecological model.

Generation of the social-ecological model begins by defining search criteria (step S201). The search criteria can be adjusted based on the scenario or operating environment for which it is desired to run the simulation. In step S202, data that is relevant to the desired output representation is acquired, using the search criteria. The data may be acquired from a variety of sources—both open and closed. FIG. 3 shows examples of the types of data that may be acquired; the data may include, for example, media items including published news media and/or social media posts/web-blogs that reflect people's interpretations of specific events and the generalised environmental context, as well as providing indications of population sentiment towards such events. Other types of data may include proprietary or sensitive data (where available), data specific to the environment being modelled, and task-specific data i.e. data of relevance to, a narrowly-defined task, mission, or community of interest. Task specific data may include, for example, relevant statistical data in the effectiveness of methods to fight large-scale wild fires, or specific data collected through intelligence-gathering and surveillance activity relating to observed pattern-of-life of a localised terrorist cell.

The data may be obtained by web-crawlers, which may both capture and anonymise opinions and data shared online. In addition, or alternatively, embodiments may make use of 'curated' data sets, such as those that may be obtained from commercial data providers and/or news and media organisations (e.g. BBC, Times Newspapers, Reuters etc), open source data sets, such as government and NGO published statistics, reports, and analysis (for example, crime figures, economic indicators, census information, public health statistics, and information relating to national infrastructure), data from financial institutions, markets, and/or exchanges, and data obtained by user communities themselves. The data may be training data, operational data, or (for security, policing, and military applications), data obtained from intelligence gathering and surveillance activities. Such data may be available from electronic archives, file systems or databases; in some cases, embodiments may utilise additional pre-processing of data (for example, to digitise hand-written accounts and/or records).

Government organisations may have access to information services subscriptions.

Dependent upon application, the nature and origin of the data will be diverse. Typically, although not exclusively, social media and news agencies will be utilised; it may also be desirable to include an independent and trusted provider of 'ground truth' i.e. factual data that is devoid of propaganda and/or opinion. Examples of such sources might be an objective and unbiased news agency or media outlet, or commercial data provider.

Referring again to FIG. 2, in step S203, the disparate and unstructured collection of data records obtained in step S202 is analysed in order to identify relationships and patterns within the data. Such relationships might include, for example, the recognition of discrete events being linked to one another, and a temporal dependence between those events. As an example, a particular announcement by a world leader or celebrity might yield a flurry of posts on social media concerning the announcement. Here, the announcement itself and a user's posting an opinion on social media might be recognised as discrete events. The latter event may have a temporal dependency on the first, in the sense that the user's post on social media will take place after the announcement, within a typical timeframe of minutes or hours.

In addition to these events, the analysis of the data may serve to identify organisations, groupings, or similarities between the people involved. For example, returning to the scenario above in which a political announcement is made, there may be a number of social media posts that follow the announcement, where those posts are determined as being similar in content and/or to originate from people within a particular social demographic, or whom are affiliated with the same political party as one another. The analysis may be carried out using one of several techniques known in the art, such as unsupervised learning; the particular technique that is used may be chosen based upon the type of data objects, associated metadata, and volume of available data.

As part of the data analysis, the source data objects and the insights gained from analysis and pre-processing (for example, the relationships and temporal dependencies discussed above), may be translated into a structured form that is suitable for supervised machine learning (steps S204 and S205). The resultant data set comprises a training data set that can be used to train a machine learning algorithm (such as an artificial neural network (ANN), for example) to recognise and predict outputs of events based on input data.

In step S206, the training data set is used for training a machine-learning algorithm or architecture, such as an artificial neural network, in order to obtain a mapping function to predict outputs from input data. It will be appreciated that one of a number of different machine learning architectures may be used, and the ANN is provided here by way of example only; moreover, different types of ANN may be utilised, including Long Short-Term Memory (LSTM) ANNs, for example. In general, any recurrent architecture that is suited to the representation of complex environments and scenarios, where it is intended to model the effects of some action(s) that are temporally separate, may be utilised.

A model generated by training the machine learning algorithm(s) can be stored for later use during a simulation. For example, having trained an ANN, a meta-graph describing the trained ANN can be generated; the meta graph will serve as the social-ecological model to be used in subsequent simulations, and can be archived to persistent storage for later use. The meta graph itself is an attributed graph, describing relationships and associated parameters of the neural network. Once generated, the model can be evaluated against the historical data sets from which it was generated.

Figure 4:
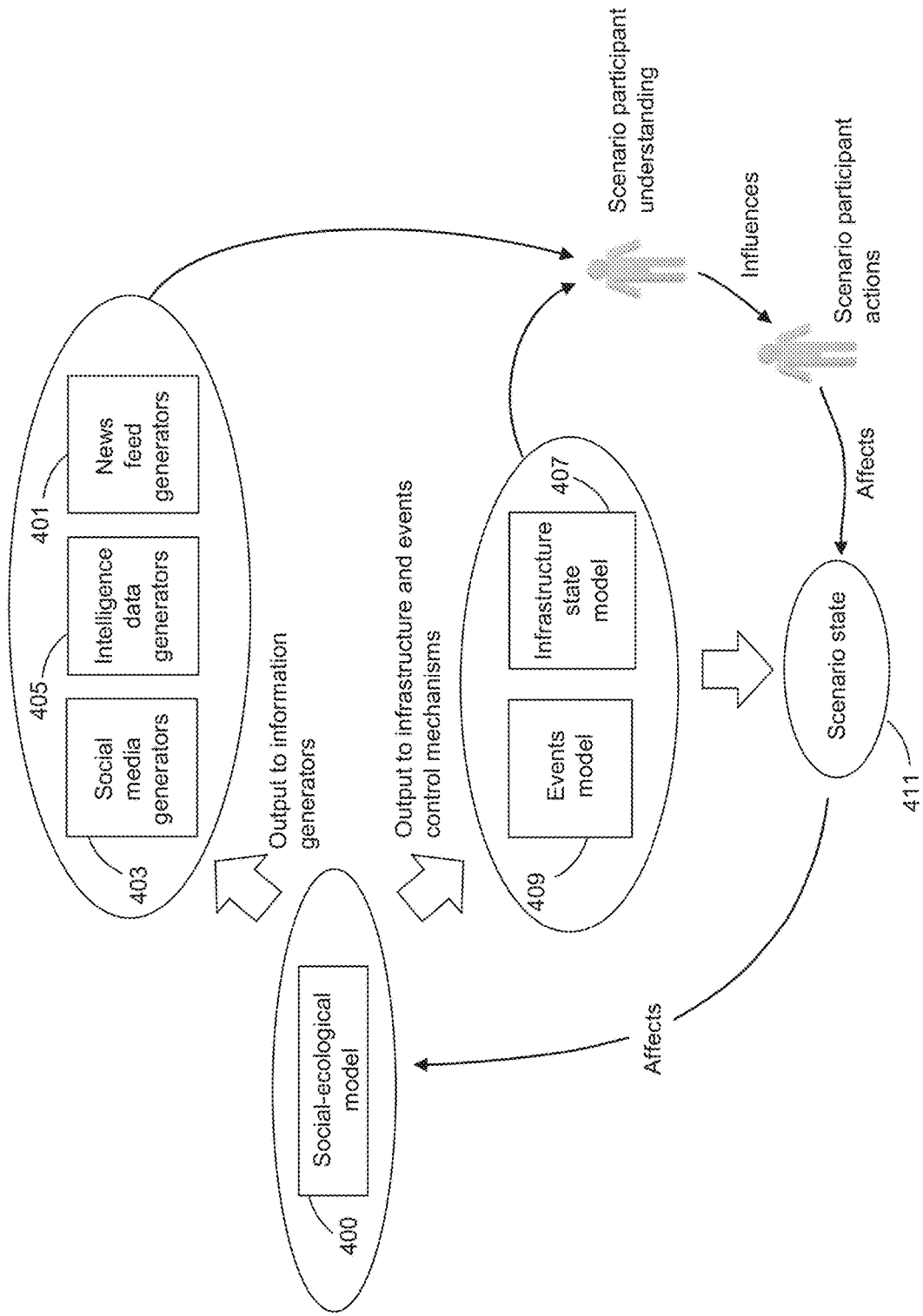
FIG. 4 shows a schematic of how a social-ecological model may be used in a simulation according to an embodiment.

The output from the social-ecological model can form the basis for a feedback loop, whereby the user's response to changes in the mood of the actors in the environment (as output by the model) can inform the user's actions, in turn defining a new set of inputs for feeding into the social-ecological model. By doing so, it is possible to track changes in sentiment of a particular demographic or target population over the course of successive events. This process is shown schematically in FIG. 4, in which outputs from the social ecological model 400 are used to generate indicators of population sentiment, which in the present example comprise news publications and opinion pieces 401, social media posts 403, and intelligence reports. At the same time, outputs from the social ecological model may be used to configure changes in infrastructure within the simulated environment through an infrastructure state model 407, or other events associated with changes in the mood of the population, through events model 409. The information so generated can inform the user's understanding of people's reactions to a chosen course of action, and in turn shape the user's subsequent actions. In turn, the output from the events model and/or infrastructure model can, together with the user's actions, lead to changes in the environment (scenario state 411), and in turn present a new set of inputs to the social ecological model, so initiating the next sequence of events. Through use of this feedback loop, the social-ecological model can ensure that each part of the simulated environment remains consistent with the present context.

In some embodiments, the social-ecological model may be updated "on the fly" i.e. during the actual runtime of the simulation itself. The simulation may run over an extended period of time (days, weeks, months, etc.) during which time public perception of events may shift as new information comes to light, shifts occur in the distribution of different demographics and/or the political and/or financial situation in the real-world changes. The social-ecological model may be updated with (real-world) data reflective of these shifts, and the outputs from the model may be adapted accordingly whilst the simulation is still ongoing. The social ecological model may be re-trained based solely on newly available data, or in the alternative, may be re-trained by extending the temporal window in which data is collected, for example, by simply continuing to supplement the training data with new data as that new data becomes available.

It will be understood that, in some embodiments, the deployment architecture will incorporate several, interconnected neural network models. This is desired to simplify the initial generation and maintenance of the model(s), and assists with the effective management of source and training data sets. More significantly, such architecture enables resulting models to be readily scalable; both in terms of enabling the models to be load-balanced and/or replicated for resilience and performance, but also to extend model scope for additional environmental aspects with respect to new source data.

Embodiments described herein can help to address the problem of insufficient scope and realism of conventional simulations by drawing upon a theoretically infinite source of characteristic data which is mechanically processed to generate representations of the environment described by the data.

Embodiments as described herein rely upon computational capabilities to significantly reduce human interpretation of environment data, and the subsequent translation of that interpretation into an algorithmic model of that environment. A resulting improvement to the representation of the environment-of-interest is enabled through the large volume of varied data that may be consumed and interpreted to describe the environment.

Importantly, in contrast to conventional simulations, the underlying model used to create the simulated environment, and on which the evolution of that environment is based, is generated using real-world data that reflects not just how the physical landscape and infrastructure is affected by events, but in addition, how people's sentiment may vary in response to those events. In so doing, embodiments herein can provide additional layers of richness and complexity in the simulated environment, enhancing the realism of the simulation and providing users with greater insight into the likely outcomes of different courses of action in the real-world.

Moreover, the means by which the simulation is generated, and in particular, the way in which the social-ecological model is configured, allows for much greater flexibility compared with conventional tools used for such simulations. By using a machine learning architecture that is trained on real-world data to generate the social-ecological model, embodiments obviate the need to hard-code new rules each time the desired parameters of the simulation change, or new information relevant to the scenario becomes available;

instead, the underlying model can be readily updated by re-training the model using the latest data, such that the outputs then predicted by the model continue to accurately convey the prevailing sentiment of different demographic groups as they evolve over time. In this way, embodiments can allow for a rapid scenario and environment generation—suitable, for example, in scenarios in which the needs of the actors evolve-rapidly, such as those found in emergency response, or specialised short-notice military missions (e.g. Special Forces, and/or Counter-Terrorism operations).

Embodiments can be implemented in software using a range of known software tools, APIs, SDKs, and software libraries. Implementations of the subject matter described in this specification can be realized using one or more computer programs, i.e., one or more modules of computer program instructions, encoded on computer storage medium for execution by, or to control the operation of, a data processing apparatus. Alternatively or in addition, the program instructions can be encoded on an artificially generated propagated signal, e.g., a machine-generated electrical, optical, or electromagnetic signal that is generated to encode information for transmission to suitable receiver apparatus for execution by a data processing apparatus. A computer storage medium can be, or be included in, a computer-readable storage device, a computer-readable storage substrate, a random or serial access memory array or device, or a combination of one or more of them. Moreover, while a computer storage medium is not a propagated signal, a computer storage medium can be a source or destination of computer program instructions encoded in an artificially generated propagated signal. The computer storage medium can also be, or be included in, one or more separate physical components or media (e.g., multiple CDs, disks, or other storage devices).

It will be appreciated that embodiments can be used in a variety of situations. In some cases, the simulation may be fully "self-contained", in the sense that each one of the actors/individuals modelled in the environment is a computer-generated character that is programmed to act in a particular way by the computer, with their actions being determined entirely by the computer (an example might be the Computer Generated Forces CGF as present in Constructive Simulations). In other cases, the simulation may form part of a larger "live" exercise, in which real-world actors carry out tasks and actions, and data representative of those actions is input into the social ecological model as part of the simulation. For example, each real-world actor may have an associated avatar that exists within the simulation, and whose actions reflect those of the individuals that in turn affect the output of the social ecological model. In some cases, a combination of actors may be present in the simulation, with some being wholly computer-generated and others being avatars representative of actual real-world people whose actions are fed into the simulation.

Embodiments can be used in e.g. training and education systems, particularly in a defence and security contexts, normally include some form of simulation, including Computer Generated Forces (CGF) or Semi-Autonomous Forces (SAF), to provide a representation of threats, friendly forces, neutral actors, and other Non-Government Organisations (NGOs) within the Synthetic Environment (SE) in which synthetic training is to be conducted. Embodiments may also have wider applications; from operational decision support systems and strategic planning within defence, security, and civil response markets, to gaming, financial markets, marketing, and public relations.

Additional examples of simulations in which embodiments may be used include:
Defence and security markets; training and education
Defence and security markets; operational decision support, trade-off studies
Financial sector strategy and outlook/forecasting
Marketing and Public relations strategy planning
Public-sector and government strategy planning
Environmental planning and impact analysis
Gaming Embodiments provide an end-to-end process for obtaining unstructured data, performing suitable processing, and using this as a training data set for machine learning to yield a model mapping appropriate inputs to outputs.

While certain embodiments have been described, these embodiments have been presented by way of example only and are not intended to limit the scope of the invention. Indeed, the novel methods, devices and systems described herein may be embodied in a variety of forms; furthermore, various omissions, substitutions and changes in the form of the methods and systems described herein may be made without departing from the spirit of the invention. The accompanying claims and their equivalents are intended to cover such forms or modifications as would fall within the scope and spirit of the invention.

The invention claimed is:

1. A method for determining one or more actions to carry out in an environment, the method comprising:
receiving action data, the action data defining an action to be performed in a simulated environment corresponding to the environment;
conducting, based on application of the action data to a social-ecological model, a simulation of performance of the action in the simulated environment, the simulation comprising generation of a simulated response that indicates an expected social response to performance of the action, wherein the social ecological model is a computer-implemented model configured to identify social responses to actions within the environment, the social ecological model being generated by obtaining environment data comprising a parameterized dataset indicative of actions taken by one or more individuals within the environment and corresponding social responses to the actions, wherein the social-ecological model is trained to determine one or more temporal relationships between two or more real-life past events and wherein a time to elapse between receiving the action data and presenting the simulated response is based on the one or more temporal relationships as determined by the social-ecological model;
determining, based on the simulated response, an action to be taken; and
generating instructions for carrying out the action in the environment.

2. A method according to claim 1, wherein the environment data is used to train the social-ecological model and includes information that is reflective of public sentiment responsive to the real-life past events.

3. A method according to claim 2, wherein generating the social-ecological model comprises identifying social responses to actions within the environment based on the public sentiment responsive to the real-life past events.

4. A method according to claim 2, wherein the environment data used to train the social-ecological model includes one or more media items.

5. A method according to claim 1, wherein the social-ecological model is trained to determine a temporal relationship between a real-life past event and a change in public sentiment following the event.

6. A method according to claim 5, wherein the change in public sentiment is expressed through material released via one or more media outlets or platforms.

7. A method according to claim 6, wherein the material includes one or more of news reports, news-feeds, web blogs, and social media posts.

8. A method according to claim 1, wherein conducting the simulation comprises generating one or more simulated media items within the simulated environment that report on the action performed.

9. A method according to claim 8, wherein the simulated media items include one or more of news reports, news-feeds, web blogs, and social media posts.

10. A method according to claim 1, wherein within the simulated environment, individuals are modelled as belonging to one or more demographics, and for each demographic, the mood of individuals in that demographic is also modelled.

11. A method according to claim 10, wherein in conducting the simulation, the mood of the individuals in each demographic is also simulated.

12. A computer-implemented method according to claim 11, wherein when conducting the simulation, one or more simulated media items are generated so as to convey the change in mood of the individuals in the one or more demographics.

13. A method according to claim 1, wherein conducting the simulation comprises modelling aspects of infrastructure within the environment.

14. A method according to claim 13, wherein within the simulated environment, individuals are modelled as belonging to one or more demographics, and for each demographic, the mood of individuals in that demographic is also modelled, wherein conducting the simulation comprises modelling a result of a change in the mood of one or more demographics on the infrastructure.

15. A method according to claim 1, wherein the action data is received from one or more users interacting with the simulated environment.

16. A method according to claim 1, wherein the social-ecological model is updated during the course of the simulation.

17. A method according to claim 16, wherein updating the social-ecological model comprises re-training the model with additional environment data.

18. A method according to claim 17, wherein the additional environment data is data obtained during the time in which the simulation is in progress.

19. A method according to claim 1, wherein the environment comprises a military scenario in which one or more individuals' actions in the environment serve to control one or more military forces deployed in the environment.

20. A computer readable medium storing computer executable instructions that when executed by the computer will cause the computer to carry out a method according to claim 1.

21. A computer system comprising one or more computer processors configured to execute a method according to claim 1.

22. A computer system according to claim 21, further comprising a user interface for receiving instructions from a user, the computer processor being configured to use the instructions as the action data.

23. A method according to claim 1, comprising:
receiving further action data following conducting the simulation; and
in response to receiving the further action data, conducting a further simulation based on the social-ecological model.

* * * * *